US012771357B2

(12) United States Patent
Wadhwa et al.

(10) Patent No.: US 12,771,357 B2
(45) Date of Patent: Oct. 20, 2026

(54) DIVIDER CIRCUIT

(71) Applicant: NXP B.V., Eindhoven (NL)

(72) Inventors: Sanjay Kumar Wadhwa, Noida (IN); Alok Kumar, Bangalore (IN)

(73) Assignee: NXP B.V., Eindhoven (NL)

( * ) Notice: Subject to any disclaimer, the term of this patent is extended or adjusted under 35 U.S.C. 154(b) by 16 days.

(21) Appl. No.: 19/039,806

(22) Filed: Jan. 29, 2025

(65) Prior Publication Data

US 2026/0149453 A1 May 28, 2026

(30) Foreign Application Priority Data

Nov. 26, 2024 (IN) ............................ 202441092263

(51) Int. Cl.

*H03K 21/10* (2006.01)
*H03K 3/037* (2006.01)
*H03K 19/096* (2006.01)
*H03L 7/099* (2006.01)

(52) U.S. Cl.

CPC ............ *H03K 21/10* (2013.01); *H03K 3/037* (2013.01); *H03K 19/0963* (2013.01); *H03L 7/0992* (2013.01)

(58) Field of Classification Search

CPC .... H03K 21/10; H03K 3/037; H03K 19/0963; H03L 7/0992
USPC .......................................................... 327/115
See application file for complete search history.

(56) References Cited

U.S. PATENT DOCUMENTS

| | | | | |
|---|---|---|---|---|
| 5,818,293 | A | 10/1998 | Brehmer et al. | |
| 6,822,495 | B2 | 11/2004 | Larsson et al. | |
| 8,836,369 | B2 | 9/2014 | Ogata et al. | |
| 9,853,630 | B2 | 12/2017 | Kao et al. | |
| 2003/0141912 | A1 | 7/2003 | Sudjian | |
| 2010/0253398 | A1* | 10/2010 | Seckin | H03K 23/667 327/117 |
| 2011/0016367 | A1 | 1/2011 | Tang et al. | |
| 2012/0025877 | A1* | 2/2012 | Zhang | H03K 23/544 327/115 |
| 2015/0015312 | A1* | 1/2015 | Tseng | H03K 21/10 327/115 |
| 2018/0183441 | A1 | 6/2018 | Ryu et al. | |

FOREIGN PATENT DOCUMENTS

| | | |
|---|---|---|
| EP | 1469604 B1 | 8/2009 |

OTHER PUBLICATIONS

Myeong-Eun Hwang et al.: "DPFFs: C2MOS Direct Path Flip-Flops for Process-Resilient Ultradynamic Voltage Scaling", Hindawi Publishing Corporation, Journal of Electrical and Computer Engineering, vol. 2016, Article ID 8268917, Apr. 3, 2016, 10 pages.

* cited by examiner

*Primary Examiner* — Tomi Skibinski

(57) ABSTRACT

A divider circuit is disclosed. The divider circuit includes a pair of differential latch circuits. The divider circuit receives complementary clock signals as a pair of differential signals. The divider circuit generates frequency divided signals based on the complementary clock signals, inverted versions of the complementary clock signals, and input signals. The frequency divided signals may be substantially ripple-free. Further, the frequency divided signals remain substantially ripple-free in a presence of the skew between the complementary clock signals.

19 Claims, 5 Drawing Sheets

DIVIDER CIRCUIT

CROSS-REFERENCE TO RELATED APPLICATIONS

This application claims priority under 35 U.S.C. § 119 to India application no. 202441092263, filed 26 Nov. 2024, the contents of which are incorporated by reference herein.

FIELD OF USE

The present disclosure relates generally to electronic circuits, and, more particularly, to a divider circuit.

BACKGROUND

A divider circuit is used in various systems such as frequency synthesizers, clock dividers, and phase-locked loops (PLLs). The divider circuit generates frequency divided versions of a pair of differential clock signals. The pair of differential clock signals are complementary signals. Further, the pair of differential clock signals are utilized by the divider circuit to update a frequency of the differential clock signals. A skew (e.g., timing misalignment) typically occurs between the pair of differential clock signals and results in deviation of the frequency divided versions of the differential clock signals from a desired frequency. As a result, a performance of a system that implements such divider circuits may be degraded.

BRIEF DESCRIPTION OF DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
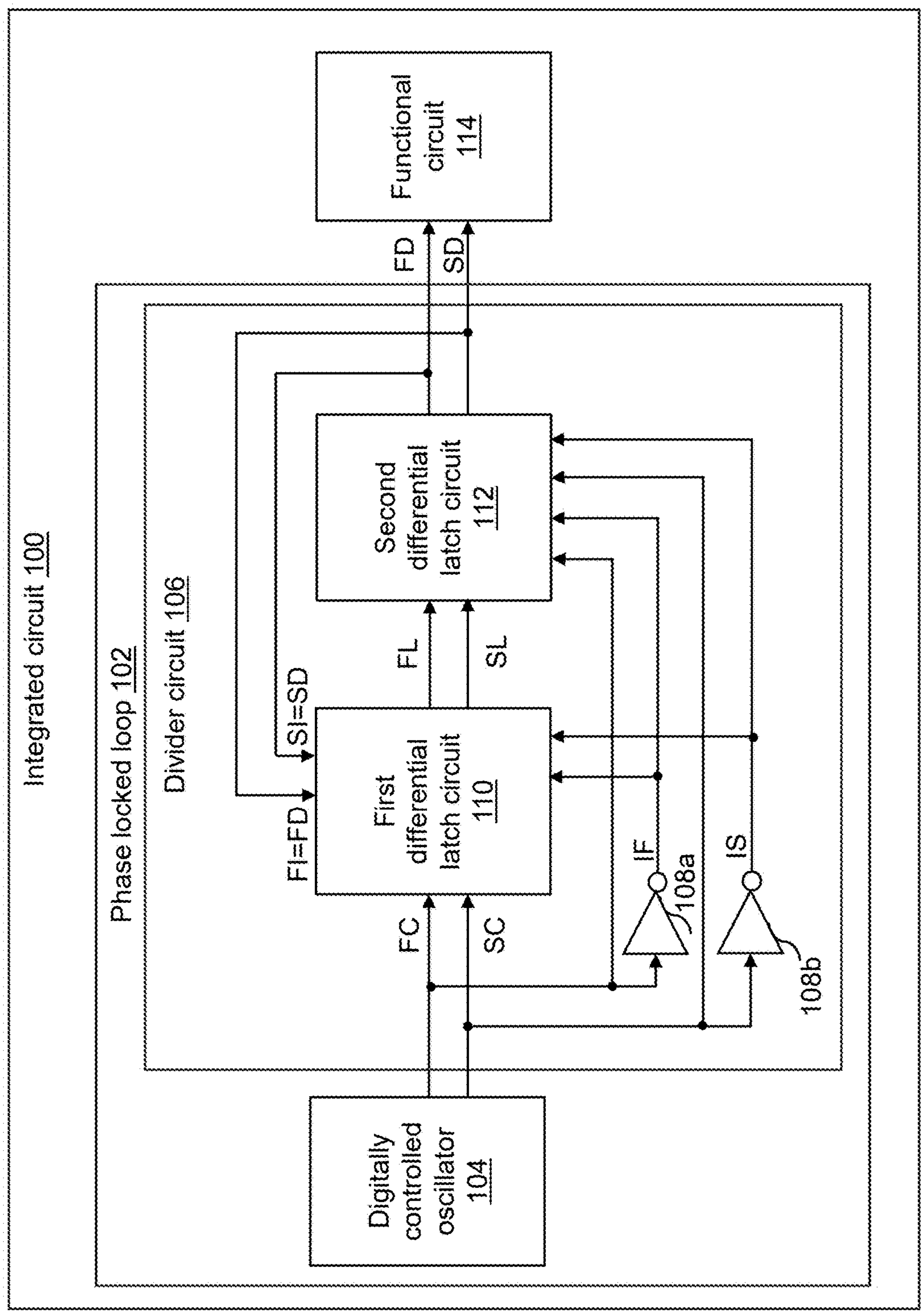
FIG. 1 illustrates a block diagram of an integrated circuit in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Overview

A divider circuit is implemented in various electronic systems to generate frequency divided versions of a pair of differential clock signals. A pair of differential clock signals include a positive clock signal and a negative clock signal that are complementary signals. The frequency divided versions of the pair of differential clock signals are utilized for one or more operations (e.g., serial data communication, synchronized read and write operations, or the like) in electronic systems. Further, the divider circuit includes two differential latch circuits that are cascaded together to generate the frequency divided versions of the positive clock signal and the negative clock signal. However, a skew between the positive and negative clock signals leads to introduction of ripples in the frequency divided versions of the positive clock signal and the negative clock signal. The introduction of ripples leads to deviation of the frequency divided versions of the positive and negative clock signals from a desired frequency. In other words, conventional divider circuits generate divided positive and negative clock signals (e.g., the frequency divided versions of the positive and negative clock signals) that deviate from a desired frequency due to the skew between the positive and negative clock signals. Thus, a performance of an electronic system that implements such divider circuits is degraded.

Various embodiments of the present disclosure disclose a divider circuit that may include a first differential latch circuit and a second differential latch circuit. The second differential latch circuit may be coupled to the first differential latch circuit. The first differential latch circuit may receive a positive clock signal, a negative clock signal, a first input signal, a second input signal, an inverted positive clock signal, and an inverted negative clock signal. The first differential latch circuit may generate a first latch signal and a second latch signal based on the first and second input signals, the positive and negative clock signals, and the inverted positive and negative clock signals. Even though a skew may be present between the positive and negative clock signals, the first differential latch circuit may generate ripple-free first and second latch signals. Further, the second differential latch circuit may receive the first and second latch signals, the positive and negative clock signals, and the inverted positive and negative clock signals. The second differential latch circuit may further generate a divided positive clock signal and a divided negative clock signal based on the first and second latch signals, the positive and negative clock signals, and the inverted positive and negative clock signals. The divided positive clock signal and the divided negative clock signal correspond to frequency divided versions of the positive and negative clock signals, respectively. The divided positive and negative clock signals may be substantially devoid of ripples. In an example, the skew between the positive and negative clock signals is 200 picoseconds and the divided positive and negative clock signals may be substantially ripple-free (e.g., free of kinks).

Thus, the divider circuit of the present disclosure generates frequency divided versions of differential clock signals (e.g., the positive and negative clock signals) that may be substantially ripple-free even in a presence of the skew between the positive and negative clock signals. In other words, the frequency divided versions of the differential clock signals have a desired frequency. Further, the divider circuit has a robust design. Thus, an electronic system that implements the divider circuit operates in a desired manner as a frequency of operation of the divider circuit may remain substantially unaffected.

FIG. 1 illustrates a block diagram of an integrated circuit (IC) 100 in accordance with an embodiment of the present disclosure. The IC 100 may include a phase-locked loop (PLL) 102. The IC 100 may be utilized in automotive devices, networking devices, mobile devices, or the like.

The PLL 102 may include a digitally controlled oscillator 104 and a divider circuit 106. In an example, the PLL 102 may correspond to a general purpose all digital PLL. Although the PLL 102 is shown to include the digitally controlled oscillator 104 and the divider circuit 106, it will be apparent to a person skilled in the art that the PLL 102 may include additional components to facilitate one or more operations of the PLL 102.

Digitally Controlled Oscillator 104

The digitally controlled oscillator 104 may include suitable circuitry that may be configured to perform one or more operations. For example, the digitally controlled oscillator 104 may be configured to generate a plurality of clock signals that includes two clock signals such as a first clock signal FC and a second clock signal SC. The first clock signal FC and the second clock signal SC may be a pair of differential clock signals. The first clock signal FC and the second clock signal SC are complementary to each other. The digitally controlled oscillator 104 may be coupled to the divider circuit 106. The digitally controlled oscillator 104 may be further configured to provide the first clock signal FC and the second clock signal SC to the divider circuit 106.

In some embodiments, the first clock signal FC may one of lead or lag the second clock signal SC, thus resulting in a skew between the first clock signal FC and the second clock signal SC. The skew between the first clock signal FC and the second clock signal SC refers to clock edges of the first clock signal FC lagging or leading the second clock signal SC (e.g., a timing mismatch between the first clock signal FC and the second clock signal SC).

Although it is described that the digitally controlled oscillator 104 generates the first clock signal FC and the second clock signal SC, the scope of the present disclosure is not limited to it. In further embodiments, the digitally controlled oscillator 104 may generate the plurality of clock signals that may include more than two clock signals.

Divider Circuit 106

The divider circuit 106 may be coupled to the digitally controlled oscillator 104 and may be configured to perform one or more operations. For example, the divider circuit 106 may be configured to receive the plurality of clock signals (e.g., the first clock signal FC and the second clock signal SC) from the digitally controlled oscillator 104. The divider circuit 106 may be further configured to generate a plurality of divided signals (e.g., a first divided signal FD and a second divided signal SD) based on the plurality of clock signals. The plurality of divided signals may correspond to frequency divided versions of the plurality of clock signals. For example, the first divided signal FD and the second divided signal SD may correspond to frequency divided versions of the first clock signal FC and the second clock signal SC, respectively. Each divided signal of the plurality of divided signals may remain substantially ripple-free in a presence of a skew between a pair of clock signals of the plurality of clock signals. For example, the first divided signal FD and the second divided signal SD may be ripple-free. The divider circuit 106 may include a plurality of inverting circuits **108*a*-108*b*, a first differential latch circuit 110, and a second differential latch circuit 112. The plurality of inverting circuits 108*a*-108*b* may include a first inverting circuit 108*a* and a second inverting circuit 108*b* as shown in FIG. 1. In an embodiment, the divider circuit 106** may be a D flip-flop.

First Inverting Circuit **108*a***

The first inverting circuit **108*a* may be coupled to the digitally controlled oscillator 104, the first differential latch circuit 110, and the second differential latch circuit 112. The first inverting circuit 108*a* may include suitable circuitry to perform one or more operations. For example, the first inverting circuit 108*a* may be configured to receive the first clock signal FC. The first inverting circuit 108*a* may be further configured to invert the first clock signal FC and provide a first inverted clock signal IF (e.g., an inverted version of the first clock signal FC) to the first differential latch circuit 110 and the second differential latch circuit 112**.

Second Inverting Circuit **108*b***

The second inverting circuit **108*b* may be coupled to the digitally controlled oscillator 104, the first differential latch circuit 110, and the second differential latch circuit 112. The second inverting circuit 108*b* may include suitable circuitry to perform one or more operations. For example, the second inverting circuit 108*b* may be configured to receive the second clock signal SC. The second inverting circuit 108*b* may be further configured to invert the second clock signal SC and provide a second inverted clock signal IS (e.g., an inverted version of the second clock signal SC) to the first differential latch circuit 110 and the second differential latch circuit 112**.

Although the first inverted clock signal IF and the second inverted clock signal IS are shown as two inverted clock signals, the scope of the present disclosure is not limited to it. In further embodiments, based on a number of clock signals in the plurality of clock signals being greater than two, a number of inverted clock signals may be more than two. In such embodiments, the plurality of inverting circuits **108*a*-108*b*** may include more than two inverting circuits.

Examples of the first inverting circuit **108*a* and the second inverting circuit 108*b*** include but are not limited to a complementary metal-oxide-semiconductor (CMOS) inverter, an inverting switch, an inverting amplifier, an inverting buffer, or the like.

First Differential Latch Circuit 110

The first differential latch circuit 110 may be coupled to the plurality of inverting circuits **108*a*-108*b*, the digitally controlled oscillator 104, and the second differential latch circuit 112. The first differential latch circuit 110 may be further configured to receive a plurality of input signals, the plurality of clock signals, and the inverted versions of the plurality of clock signals from the second differential latch circuit 112, the digitally controlled oscillator 104, and the plurality of inverting circuits 108*a*-108*b***, respectively.

The plurality of input signals may include a first input signal FI and a second input signal SI as shown in FIG. 1. The first differential latch circuit 110 may be further configured to generate a plurality of latch signals (e.g., a first latch signal FL and a second latch signal SL) based on the plurality of input signals, the plurality of clock signals, and the inverted versions of the plurality of clock signals as explained in FIG. 2A. In other words, the first differential latch circuit 110 may generate the first latch signal FL and the second latch signal SL based on the first clock signal FC, the second clock signal SC, the first inverted clock signal IF, the second inverted clock signal IS, the first input signal FI, and the second input signal SI.

A ripple in a latch signal is an unwanted fluctuation or variation in a voltage level or a timing component of the latch signal that may occur due to a skew between the pair of differential clock signals FC and SC. Each latch signal of the plurality of latch signals may be substantially ripple-free as explained herein. In a scenario, a rising edge of the first clock signal FC leads a falling edge of the second clock signal SC by 200 picoseconds (ps) skew. Further, the first input signal FI may be de-asserted and the second input signal SI may be asserted. Thus, the first differential latch circuit 110 generates the first latch signal FL at a de-asserted state and the second latch signal SL at an asserted state based on the second clock signal SC being de-asserted (e.g., after the falling edge of the second clock signal SC). Further, the first differential latch circuit 110 maintains the first latch signal FL at the asserted state and the second latch signal SL at the de-asserted state until a next falling edge of the second clock signal SC. As a result, the first and second latch signals FL and SL are insensitive to the 200 ps skew. Thus, the first and second latch signals FL and SL may be substantially ripple-free.

Second Differential Latch Circuit 112

The second differential latch circuit 112 may be coupled to the plurality of inverting circuits 108*a*-108*b*, the digitally controlled oscillator 104, and the first differential latch circuit 110. The second differential latch circuit 112 may be further configured to receive the plurality of latch signals, the plurality of clock signals, and the inverted version of the plurality of clock signals from the first differential latch circuit 110, the digitally controlled oscillator 104, and the plurality of inverting circuits 108*a*-108*b*, respectively. The second differential latch circuit 112 may be further configured to generate the plurality of divided signals (e.g., the first divided signal FD and the second divided signal SD) based on the plurality of latch signals, the plurality of clock signals, and the inverted versions of the plurality of clock signals as explained in FIG. 2B. The plurality of divided signals correspond to frequency divided versions of the plurality of clock signals. In an example, a frequency of each clock signal of the plurality of clock signals is 100 megahertz (MHz) and a frequency of each divided signal of the plurality of divided signals is 50 MHz as the divider circuit 106 corresponds to a divide by two circuit. The plurality of divided signals may further correspond to the plurality of input signals.

Ripple in a divided signal refers to unwanted fluctuations or variations in a voltage level or a timing component of the divided signal that occur due to the skew between the pair of clock signals utilized for the generation of the divided signal. Each divided signal of the plurality of divided signals is independent of a skew between a pair of clock signals of the plurality of clock signals. Thus, each divided signal of the plurality of divided signals may be substantially ripple-free as explained herein. For example, the first divided signal FD and the second divided signal SD may be substantially ripple-free irrespective of the skew between the first clock signal FC and the second clock signal SC.

In a scenario, a rising edge of the second clock signal SC leads a falling edge of the first clock signal FC by 200 ps skew. Thus, the second differential latch circuit 112 generates the first divided signal FD at an asserted state and the second divided signal SD at a de-asserted state based on the first clock signal FC being de-asserted (e.g., after the falling edge of the first clock signal FC). Further, the second differential latch circuit 112 maintains the first divided signal FD at the asserted state and the second divided signal SD at the de-asserted state until a next falling edge of the first clock signal FC. As a result, the first and second divided signals FD and SD are insensitive to the 200 ps skew. Thus, the first and second divided signals FD and SD may be substantially ripple-free. The first and second divided signals FD and SD are independent of the skew based on utilization of the first latch signal FL, the second latch signal SL, the first clock signal FC, the second clock signal SC, the first inverted clock signal IF, and the second inverted clock signal IS by the second differential latch circuit 112 for the generation of the first and second divided signals FD and SD.

The second differential latch circuit 112 may be further configured to provide the plurality of divided signals as the plurality of input signals to the first differential latch circuit 110. Examples of the first differential latch circuit 110 and the second differential latch circuit 112 include but are not limited to a differential D latch circuit, a differential SR latch circuit, or the like.

The IC 100 may further include a functional circuit 114 that may be coupled to the PLL 102. The functional circuit 114 may include suitable circuitry that may be configured to perform one or more operations. For example, the functional circuit 114 may be configured to receive the first divided signal FD and the second divided signal SD from the divider circuit 106 and perform one or more functional operations associated therewith based on the first divided signal FD and the second divided signal SD. Examples of the functional circuit 114 may include frequency synthesizers, frequency modulators, frequency demodulators, clock recovery circuits, tone decoders, a memory, a sensor, an input/output circuit, a processor, a communications circuit, or the like. Further, the functional circuit 114 may be one of an analog circuit, a digital circuit, or any combination thereof.

Although the divider circuit 106 is shown to include two differential latch circuits, the scope of the present disclosure is not limited to it. In additional embodiments, the divider circuit 106 may include a plurality of differential latch circuits that include more than two differential latch circuits without deviating from the scope of the present disclosure.

The scope of the present disclosure is not limited to the realization of the divider circuit 106 in the PLL 102. In other embodiments, the divider circuit 106 may be realized in various electronic circuits such as analog-to-digital converters.

Figure 2A:
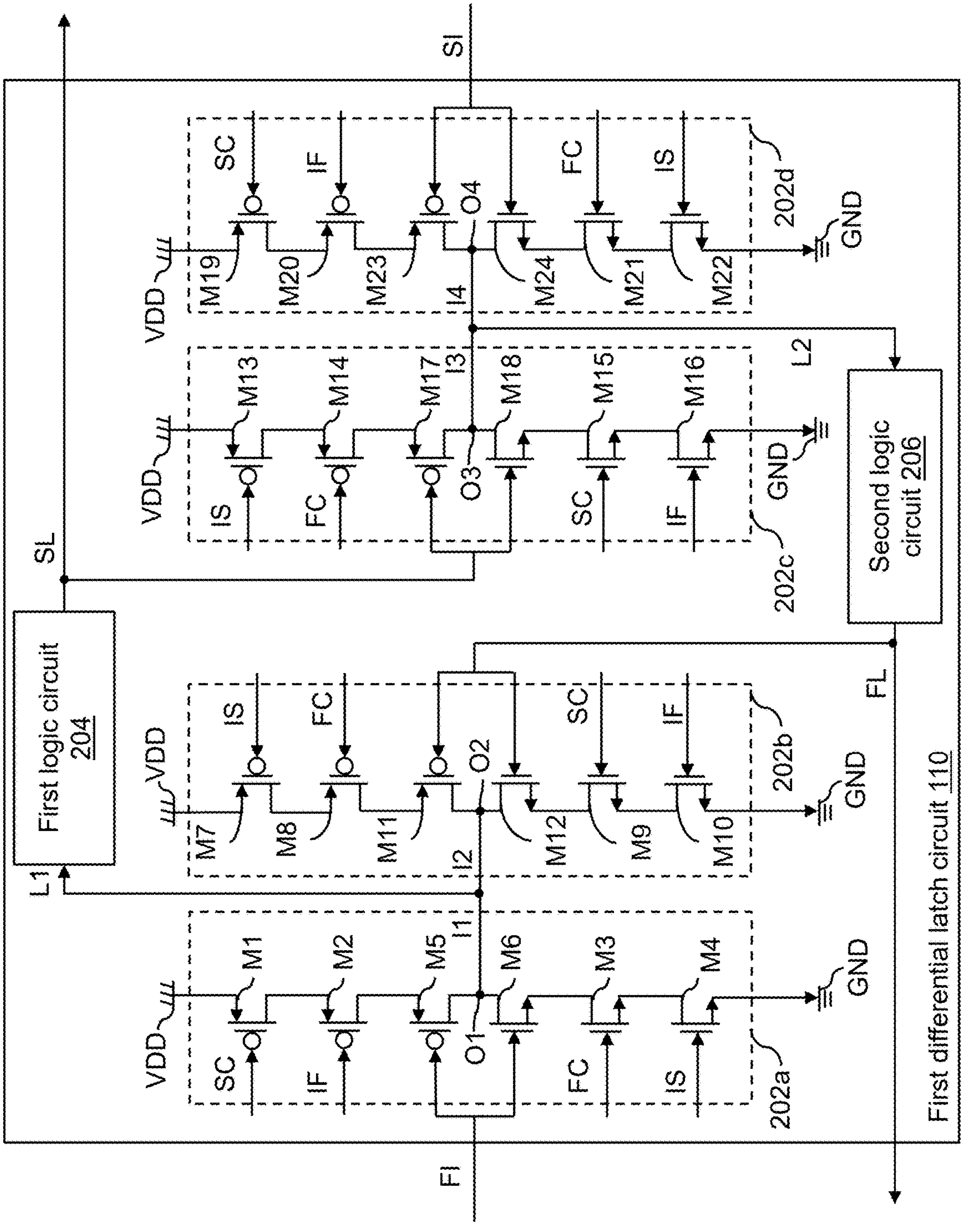
FIG. 2A illustrates a block diagram of a first differential latch circuit of a divider circuit of the integrated circuit of FIG. 1 in accordance with an embodiment of the present disclosure.

FIG. 2A illustrates a block diagram of the first differential latch circuit 110 in accordance with an embodiment of the present disclosure. The first differential latch circuit 110 may include first, second, third, and fourth inverters 202*a*-202*d*, a first logic circuit 204, and a second logic circuit 206. Each of the first through fourth inverters 202*a*-202*d* may be configured to receive the plurality of clock signals (e.g., the first clock signal FC and the second clock signal SC) and the inverted versions of the plurality of clock signals (e.g., the inverted first clock signal IF and the inverted second clock signal IS). The inverted versions of the plurality of clock signals are hereinafter referred to as the "plurality of inverted clock signals". A power source terminal VDD of the IC 100 and a ground terminal GND of the IC 100 are shown in FIG. 2A.

First Inverter 202*a*

The first inverter 202*a* may be coupled to the digitally controlled oscillator 104, the plurality of inverting circuits 108*a*-108*b*, the second differential latch circuit 112, and the first logic circuit 204. The first inverter 202*a* may be further configured to receive the first input signal FI, the first clock signal FC, the second clock signal SC, the first inverted clock signal IF, and the second inverted clock signal IS. The first inverter 202*a* may be further configured to output a first inverter signal I1 based on the first input signal FI, the first clock signal FC, the second clock signal SC, the first inverted clock signal IF, and the second inverted clock signal IS.

The first inverter 202*a* may include a first plurality of transistors M1-M6 that may be connected in a cascade form between the power source terminal VDD and the ground terminal GND. The first plurality of transistors M1-M6 may include a first subset of transistors M1-M4 and a second subset of transistors M5-M6. Further, the first subset of transistors M1-M4 may include first through fourth transistors M1-M4, and the second subset of transistors M5-M6 may include fifth and sixth transistors M5 and M6. Each transistor of the first plurality of transistors M1-M6 may include a first current terminal, a second current terminal, and a control terminal. In an embodiment, the first current terminal, the second current terminal, and the control terminal correspond to source, drain, and gate terminals of a corresponding transistor.

The first current terminal of the first transistor M1 may be coupled to the power source terminal VDD and the second current terminal of the first transistor M1 may be coupled to the first current terminal of the second transistor M2. Further, the second current terminal of the second transistor M2 is coupled to the first current terminal of the fifth transistor M5. Additionally, the second current terminal of the fifth transistor M5 is coupled to the second current terminal of the sixth transistor M6. Furthermore, the first current terminal of the sixth transistor M6 is coupled to the second current terminal of the third transistor M3. The first current terminal of the third transistor M3 is coupled to the second current terminal of the fourth transistor M4. The first current terminal of the fourth transistor M4 is coupled to the ground terminal GND.

The first subset of transistors M1-M4 may be configured to receive the plurality of clock signals and the plurality of inverted clock signals. In other words, the control terminal of the first transistor M1 may receive the second clock signal SC, the control terminal of the second transistor M2 may receive the first inverted clock signal IF, the control terminal of the third transistor M3 may receive the first clock signal FC, and the control terminal of the fourth transistor M4 may receive the second inverted clock signal IS. Further, the second subset of transistors M5-M6 may be configured to receive the first input signal FI and output the first inverter signal I1. In other words, the control terminal of the fifth transistor M5 and the control terminal of the sixth transistor M6 may receive the first input signal FI. Further, a first output node O1 formed by the coupling of the second current terminal of the fifth transistor M5 and the second current terminal of the sixth transistor M6 outputs the first inverter signal I1.

Each of the first transistor M1, the second transistor M2, and the fifth transistor M5 may be a p-channel metal-oxide semiconductor (PMOS) transistor. Thus, the first transistor M1, the second transistor M2, and the fifth transistor M5 may be collectively referred to as a "PMOS string of the first inverter 202*a*" or a "stack of first conductivity type transistors". Each of the third transistor M3, the fourth transistor M4, and the sixth transistor M6 may be an n-channel metal oxide semiconductor (NMOS) transistor. Thus, the third transistor M3, the fourth transistor M4, and the sixth transistor M6 may be collectively referred to as an "NMOS string of the first inverter 202*a*" or a "stack of second conductivity type transistors". Operation of the first inverter 202*a* is further explained in detail in the ongoing specification.

Second Inverter 202*b*

The second inverter 202*b* may be coupled to the digitally controlled oscillator 104, the plurality of inverting circuits 108*a*-108*b*, the first logic circuit 204, and the second logic circuit 206. The second inverter 202*b* may be configured to receive the first latch signal FL, the first clock signal FC, the second clock signal SC, the first inverted clock signal IF, and the second inverted clock signal IS. The second inverter 202*b* may be further configured to output a second inverter signal I2 based on the first latch signal FL, the first clock signal FC, the second clock signal SC, the first inverted clock signal IF, and the second inverted clock signal IS.

The second inverter 202*b* may include a second plurality of transistors M7-M12 that may be connected in a cascade form between the power source terminal VDD and the ground terminal GND. The second plurality of transistors M7-M12 may include a third subset of transistors M7-M10 and a fourth subset of transistors M11-M12. Further, the third subset of transistors M7-M10 may include seventh through tenth transistors M7-M10, and the fourth subset of transistors M11-M12 may include an eleventh transistor M11 and a twelfth transistor M12. Each transistor of the second plurality of transistors M7-M12 may include a first current terminal, a second current terminal, and a control terminal. In an embodiment, the first current terminal, the second current terminal, and the control terminal correspond to source, drain, and gate terminals of a corresponding transistor.

The first current terminal of the seventh transistor M7 may be coupled to the power source terminal VDD and the second current terminal of the seventh transistor M7 may be coupled to the first current terminal of the eighth transistor M8. Further, the second current terminal of the eighth transistor M8 is coupled to the first current terminal of the eleventh transistor M11. Additionally, the second current terminal of the eleventh transistor M11 is coupled to the second current terminal of the twelfth transistor M12. Furthermore, the first current terminal of the twelfth transistor M12 is coupled to the second current terminal of the ninth transistor M9. The first current terminal of the ninth transistor M9 is coupled to the second current terminal of the tenth transistor M10. Further, the first current terminal of the tenth transistor M10 is coupled to the ground terminal GND.

The third subset of transistors M7-M10 may be configured to receive the plurality of clock signals and the plurality of inverted clock signals. In other words, the control terminal of the seventh transistor M7 may receive the second inverted clock signal IS, the control terminal of the eighth transistor M8 may receive the first clock signal FC, the control terminal of the ninth transistor M9 may receive the second clock signal SC, and the control terminal of the tenth transistor M10 may receive the first inverted clock signal IF. Further, the fourth subset of transistors M11-M12 may be configured to receive the first latch signal FL and output the second inverter signal I2. In other words, the control terminal of the eleventh transistor M11 and the control terminal of the twelfth transistor M12 may receive the first latch signal FL. Further, a second output node O2 may be formed by the coupling of the second current terminal of the eleventh transistor M11 and the second current terminal of the twelfth transistor M12 to output the second inverter signal I2. Additionally, the first and second output nodes O1 and O2 are shorted. In other words, the first and second output nodes are directly electrically coupled together. As used herein, the term "shorted" refers to direct electrical coupling of two output nodes.

Each of the seventh transistor M7, the eighth transistor M8, and the eleventh transistor M11 may be a PMOS transistor. Thus, the seventh transistor M7, the eighth transistor M8, and the eleventh transistor M11 may be collectively referred to as a "PMOS string of the second inverter 202*b*" or a "stack of first conductivity type transistors". Each of the ninth transistor M9, the tenth transistor M10, and the twelfth transistor M12 may be an NMOS transistor. Thus, the ninth transistor M9, the tenth transistor M10, and the twelfth transistor M12 may be collectively referred to as an "NMOS string of the second inverter 202*b*" or a "stack of second conductivity type transistors". Operation of the second inverter 202*b* is further explained in detail in the ongoing specification.

Third Inverter 202*c*

The third inverter 202*c* may be coupled to the digitally controlled oscillator 104, the plurality of inverting circuits 108*a*-108*b*, the first logic circuit 204, and the second logic circuit 206. The third inverter 202*c* may be configured to receive the second latch signal SL, the first clock signal FC, the second clock signal SC, the first inverted clock signal IF, and the second inverted clock signal IS. The third inverter 202*c* may be further configured to output a third inverter signal I3 based on the second latch signal SL, the first clock signal FC, the second clock signal SC, the first inverted clock signal IF, and the second inverted clock signal IS.

The third inverter 202*c* may include a third plurality of transistors M13-M18 that may be connected in a cascade form between the power source terminal VDD and the ground terminal GND. The third plurality of transistors M13-M18 may include a fifth subset of transistors M13-M16 and a sixth subset of transistors M17-M18. The fifth subset of transistors M13-M16 may include thirteenth through sixteenth transistors M13-M16, and the sixth subset of transistors M17-M18 may include a seventeenth transistor M17 and an eighteenth transistor M18. Each transistor of the third plurality of transistors M13-M18 may include a first current terminal, a second current terminal, and a control terminal. In an embodiment, the first current terminal, the second current terminal, and the control terminal correspond to source, drain, and gate terminals of a corresponding transistor.

The first current terminal of the thirteenth transistor M13 may be coupled to the power source terminal VDD and the second current terminal of the thirteenth transistor M13 may be coupled to the first current terminal of the fourteenth transistor M14. Further, the second current terminal of the fourteenth transistor M14 is coupled to the first current terminal of the seventeenth transistor M17. Additionally, the second current terminal of the seventeenth transistor M17 is coupled to the second current terminal of the eighteenth transistor M18. Furthermore, the first current terminal of the eighteenth transistor M18 is coupled to the second current terminal of the fifteenth transistor M15. The first current terminal of the fifteenth transistor M15 is coupled to the second current terminal of the sixteenth transistor M16. The first current terminal of the sixteenth transistor M16 is coupled to the ground terminal GND.

The fifth subset of transistors M13-M16 may be configured to receive the plurality of clock signals and the plurality of inverted clock signals. In other words, the control terminal of the thirteenth transistor M13 may receive the second inverted clock signal IS, the control terminal of the fourteenth transistor M14 may receive the first clock signal FC, the control terminal of the fifteenth transistor M15 may receive the second clock signal SC, and the control terminal of the sixteenth transistor M16 may receive the first inverted clock signal IF. Further, the sixth subset of transistors M17-M18 may be configured to receive the second latch signal SL and output the third inverter signal I3. In other words, the control terminal of the seventeenth transistor M17 and the control terminal of the eighteenth transistor M18 may receive the second latch signal SL. Further, a third output node O3 formed by the coupling of the second current terminal of the seventeenth transistor M17 and the second current terminal of the eighteenth transistor M18 outputs the third inverter signal I3.

Each of the thirteenth transistor M13, the fourteenth transistor M14, and the seventeenth transistor M17 may be a PMOS transistor. Thus, the thirteenth transistor M13, the fourteenth transistor M14, and the seventeenth transistor M17 may be collectively referred to as a "PMOS string of the third inverter 202*c*" or a "stack of first conductivity type transistors". Each of the fifteenth transistor M15, the sixteenth transistor M16, and the eighteenth transistor M18 may be an NMOS transistor. Thus, the fifteenth transistor M15, the sixteenth transistor M16, and the eighteenth transistor M18 may be collectively referred to as an "NMOS string of the third inverter 202*c*" or a "stack of second conductivity type transistors". Operation of the third inverter 202*c* is further explained in detail in the ongoing specification.

Fourth Inverter 202*d*

The fourth inverter 202*d* may be coupled to the digitally controlled oscillator 104, the plurality of inverting circuits 108*a*-108*b*, the second differential latch circuit 112, and the second logic circuit 206. The fourth inverter 202*d* may be further configured to receive the second input signal SI, the first clock signal FC, the second clock signal SC, the first inverted clock signal IF, and the second inverted clock signal IS. The fourth inverter 202*d* may be further configured to output a fourth inverter signal I4 based on the second input signal SI, the first clock signal FC, the second clock signal SC, the first inverted clock signal IF, and the second inverted clock signal IS.

The fourth inverter 202*d* may include a fourth plurality of transistors M19-M24 that may be connected in a cascade form between the power source terminal VDD and the ground terminal GND. The fourth plurality of transistors M19-M24 may include a seventh subset of transistors M19-M22 and an eighth subset of transistors M23-M24. Further, the seventh subset of transistors M19-M22 may include nineteenth through twenty-second transistors M19-M22, and the eighth subset of transistors M23-M24 may include a twenty-third transistor M23 and a twenty-fourth transistor M24. Each transistor of the fourth plurality of transistors M19-M24 may include a first current terminal, a second current terminal, and a control terminal. In an embodiment, the first current terminal, the second current terminal, and the control terminal correspond to source, drain, and gate terminals of a corresponding transistor.

The first current terminal of the nineteenth transistor M19 may be coupled to the power source terminal VDD and the second current terminal of the nineteenth transistor M19 may be coupled to the first current terminal of the twentieth transistor M20. Further, the second current terminal of the twentieth transistor M20 is coupled to the first current terminal of the twenty-third transistor M23. Additionally, the second current terminal of the twenty-third transistor M23 is coupled to the second current terminal of the twenty-fourth transistor M24. Furthermore, the first current terminal of the twenty-fourth transistor M24 is coupled to the second current terminal of the twenty-first transistor M21. The first current terminal of the twenty-first transistor M21 is coupled to the second current terminal of the twenty-second transistor M22. Further, the first current terminal of the twenty-second transistor M22 is coupled to the ground terminal GND.

The seventh subset of transistors M19-M22 may be configured to receive the plurality of clock signals and the plurality of inverted clock signals. In other words, the control terminal of the nineteenth transistor M19 may receive the second clock signal SC, the control terminal of the twentieth transistor M20 may receive the first inverted clock signal IF, the control terminal of the twenty-first transistor M21 may receive the first clock signal FC, and the control terminal of the twenty-second transistor M22 may receive the second inverted clock signal IS. Further, the eighth subset of transistors M23-M24 may be configured to receive the second input signal SI and output the fourth inverter signal I4. In other words, the control terminals of the twenty-third transistor M23 and the twenty-fourth transistor M24 may receive the second input signal SI. Further, a fourth output node O4 formed by the coupling of the second current terminal of the twenty-third transistor M23 and the second current terminal of the twenty-fourth transistor M24 outputs the fourth inverter signal I4. Additionally, the third and fourth output nodes O3 and O4 are shorted.

Each of the nineteenth transistor M19, the twentieth transistor M20, and the twenty-third transistor M23 may be a PMOS transistor. Thus, the nineteenth transistor M19, the twentieth transistor M20, and the twenty-third transistor M23 may be collectively referred to as a "PMOS string of the fourth inverter 202*d*" or a "stack of first conductivity type transistors". Each of the twenty-first transistor M21, the twenty-second transistor M22, and the twenty-fourth transistor M24 may be an NMOS transistor. Thus, the twenty-first transistor M21, the twenty-second transistor M22, and the twenty-fourth transistor M24 may be collectively referred to as an "NMOS string of the fourth inverter 202*d*" or a "stack of second conductivity type transistors".

First Logic Circuit 204

The first logic circuit 204 may be coupled to the first inverter 202*a*, the second inverter 202*b*, the third inverter 202*c*, and the second differential latch circuit 112. The first logic circuit 204 may include suitable circuity to perform one or more operations. For example, the first logic circuit 204 may be configured to receive a first logic signal L1 from the shorted first and second output nodes O1 and O2. The first logic signal is based on the first inverter signal I1 and the second inverter signal I2. The first logic circuit 204 may be further configured to hold a first voltage level of the first logic signal L1 for a time duration that is based on the first clock signal FC lagging or leading the second clock signal SC. In further embodiments, the first logic circuit 204 may correspond to a first pair of back-to-back inverters. The first logic circuit 204 may be further configured to output the second latch signal SL based on the first voltage level of the first logic signal L1.

Second Logic Circuit 206

The second logic circuit 206 may be coupled to the second inverter 202*b*, the third inverter 202*c*, the fourth inverter 202*d*, and the second differential latch circuit 112. The second logic circuit 206 may include suitable circuity to perform one or more operations. For example, the second logic circuit 206 may be configured to receive a second logic signal L2 from the shorted third and fourth output nodes O3 and O4. The second logic signal L2 may be based on the third inverter signal I3 and the fourth inverter signal I4. The second logic circuit 206 may be further configured to hold a second voltage level of the second logic signal L2 for the time duration that is based on the first clock signal FC lagging or leading the second clock signal SC. In further embodiments, the second logic circuit 206 may correspond to a second pair of back-to-back inverters. The second logic circuit 206 may be further configured to output the first latch signal FL based on the second voltage level of the second logic signal L2.

For the sake of ongoing discussion, it is assumed that a PMOS transistor may be turned ON when a control terminal of the corresponding PMOS transistor receives an input signal that is in a de-asserted state. Similarly, an NMOS transistor may be turned ON when a control terminal of the corresponding NMOS transistor receives an input signal that is in an asserted state.

In a scenario, the first input signal FI is de-asserted. Thus, the second input signal SI is asserted. Further, the rising edge of the first clock signal FC leads the falling edge of the second clock signal SC. A time period by which the rising edge of the first clock signal FC leads the falling edge of the second clock signal SC may be a skew time. During the skew time, as the first clock signal FC is asserted, the third transistor M3 is turned ON. Further, as the second clock signal SC is asserted and the first inverted clock signal IF is de-asserted, the first transistor M1 is turned OFF and the second transistor M2 is turned ON, respectively. Further, during the skew time, as the second inverted clock signal IS is de-asserted, the fourth transistor M4 is turned OFF, and as the first input signal FI is de-asserted, the fifth transistor M5 is turned ON and the sixth transistor M6 is turned OFF. Thus, the PMOS string and the NMOS string of the first inverter 202*a* are turned OFF during the skew time. Similarly, the second inverter 202*b*, the third inverter 202*c*, and the fourth inverter 202*d* remain in the OFF state during the skew time. As a result, the first differential latch circuit 110 is skew independent.

After the falling edge of the second clock signal SC (e.g., after the skew time), the first transistor M1 is turned ON. Thus, the PMOS string of the first inverter 202*a* and the NMOS string of the fourth inverter 202*d* may turn ON. When the PMOS string of the first inverter 202*a* is turned ON, the first inverter signal I1 outputted by the first output node O1 may follow a supply voltage (e.g., 2.4 volts or 5 volts) of the power source terminal VDD. As a result, the first logic circuit 204 receives the first inverter signal I1 as the first logic signal L1, and outputs the asserted second latch signal SL. When the NMOS string of the fourth inverter 202*d* is turned ON, the fourth inverter signal I4 may be pulled to a ground voltage (e.g., 0 volts or less) based on the coupling to the ground terminal GND. As a result, the second logic circuit 206 receives the fourth inverter signal I4 as the second logic signal L2 and outputs the first latch signal FL that is de-asserted. Additionally, the second inverter 202*b* and the third inverter 202*c* may be tri-stated when the first clock signal FC is asserted after the rising edge. Further, the second inverter 202*b* and the third inverter 202*c* are tri-stated as the PMOS strings and the NMOS strings of the second inverter 202*b* and the third inverter 202*c* are in an OFF state.

When the falling edge of the first clock signal FC leads the rising edge of the second clock signal SC by the skew time, the first through fourth inverters 202*a*-202*d* remain in the OFF state during the skew time. As a result, the first logic circuit 204 holds the first voltage level of the first logic signal L1 that corresponds to a voltage level of the first inverter signal I1, and outputs the second latch signal SL. Similarly, the second logic circuit 206 holds the second voltage level of the second logic signal L2 that corresponds to a voltage level of the fourth inverter signal I4 during the skew time. Thus, floating voltage levels of the first latch signal FL and the second latch signal SL are avoided.

In a further scenario, the first input signal FI may be asserted and the second input signal SI may be de-asserted. In such a scenario, after the rising edge of the second clock signal SC, the PMOS string of the second inverter 202*b* and the NMOS string of the third inverter 202*c* may be turned ON. Further, the first inverter 202*a* and the fourth inverter 202*d* may be tri-stated. As a result, the second inverter signal I2 may follow the supply voltage of the power source terminal VDD. As a result, the first logic circuit 204 receives the second inverter signal I2 as the first logic signal L1 and outputs the asserted second latch signal SL. Thus, the second latch signal SL corresponds to one of the first inverter signal I1 and the second inverter signal I2. Additionally, the third inverter signal I3 may be pulled to the ground voltage of the ground terminal GND. As a result, the second logic circuit 206 receives the third inverter signal I3 as the second logic signal L2, and outputs the de-asserted first latch signal FL (e.g., one of the de-asserted third inverter signal I3 and the de-asserted fourth inverter signal I4). Thus, a ripple-free first latch signal FL and a ripple-free second latch signal SL may be outputted.

To summarize, the first through fourth inverters 202*a*-202*d* may be configured to receive the plurality of input signals, the plurality of clock signals, and the plurality of inverted clock signals. The first through fourth inverters 202*a*-202*d* may be further configured to output the plurality of latch signals based on the plurality of input signals, the plurality of clock signals, and the plurality of inverted clock signals such that each latch signal of the plurality of latch signals may be substantially ripple-free.

The operation of the first through fourth inverters 202*a*-202*d*, the first logic circuit 204, and the second logic circuit 206 based on the first input signal FI being asserted, the second input signal SI being de-asserted, the first clock signal FC being asserted, and the second clock signal SC being de-asserted will be apparent to a person skilled in the art. Additionally, the operation of the first through fourth inverters 202*a*-202*d*, the first logic circuit 204, and the second logic circuit 206 when the falling edge of the second clock signal SC leads the rising edge of the first clock signal FC will be understood by a person skilled in the art.

Figure 2B:
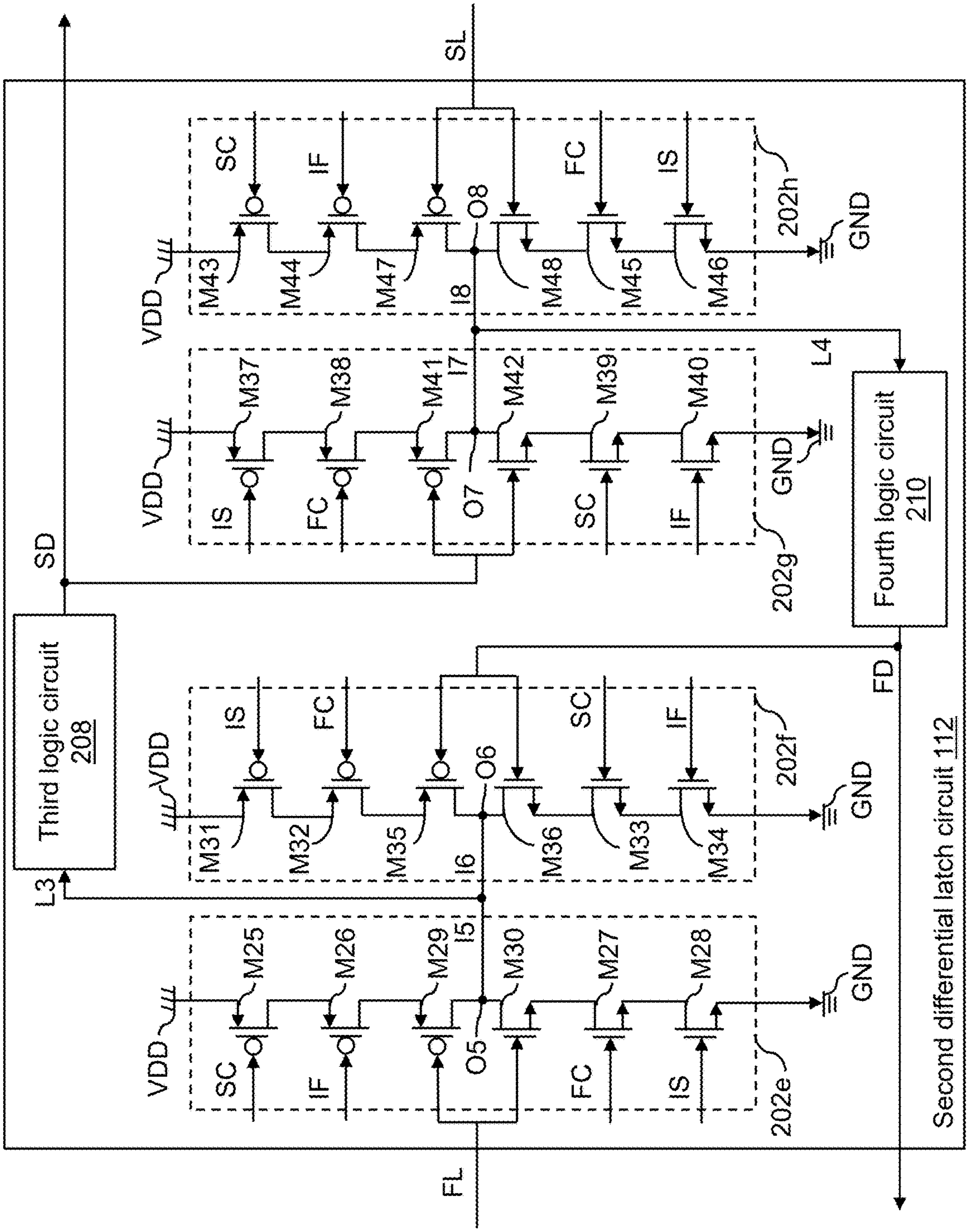
FIG. 2B illustrates a block diagram of a second differential latch circuit of the divider circuit of the integrated circuit of FIG. 1 in accordance with an embodiment of the present disclosure.

FIG. 2B illustrates a block diagram of the second differential latch circuit 112 in accordance with an embodiment of the present disclosure. The second differential latch circuit 112 may include fifth, sixth, seventh, and eighth inverters 202*e*-202*h*, a third logic circuit 208, and a fourth logic circuit 210. Each of the fifth through eighth inverters 202*e*-202*h* may be configured to receive the plurality of clock signals (e.g., the first clock signal FC and the second clock signal SC) and the plurality of inverted clock signals (e.g., the inverted first clock signal IF and the inverted second clock signal IS). The power source terminal VDD of the IC 100 and the ground terminal GND of the IC 100 are further shown in FIG. 2B.

Fifth Inverter 202*e*

The fifth inverter 202*e* may be coupled to the digitally controlled oscillator 104, the plurality of inverting circuits 108*a*-108*b*, the first differential latch circuit 110, and the third logic circuit 208. The fifth inverter 202*e* may be further configured to receive the first latch signal FL, the first clock signal FC, the second clock signal SC, the first inverted clock signal IF, and the second inverted clock signal IS. The fifth inverter 202*e* may be further configured to output a fifth inverter signal I5 based on the first latch signal FL, the first clock signal FC, the second clock signal SC, the first inverted clock signal IF, and the second inverted clock signal IS.

The fifth inverter 202*e* may include a fifth plurality of transistors M25-M30 that may be connected in a cascade form between the power source terminal VDD and the ground terminal GND. The fifth plurality of transistors M25-M30 may include a ninth subset of transistors M25-M28 and a tenth subset of transistors M29-M30. Further, the ninth subset of transistors M25-M28 may include twenty-fifth through twenty-eighth transistors M25-M28, and the tenth subset of transistors M29-M30 may include a twenty-ninth transistor M29 and a thirtieth transistor M30. Each transistor of the fifth plurality of transistors M25-M30 may include a first current terminal, a second current terminal, and a control terminal. In an embodiment, the first current terminal, the second current terminal, and the control terminal correspond to source, drain, and gate terminals of a corresponding transistor.

The first current terminal of the twenty-fifth transistor M25 may be coupled to the power source terminal VDD and the second current terminal of the twenty-fifth transistor M25 may be coupled to the first current terminal of the twenty-sixth transistor M26. Further, the second current terminal of the twenty-sixth transistor M26 is coupled to the first current terminal of the twenty-ninth transistor M29. Additionally, the second current terminal of the twenty-ninth transistor M29 is coupled to the second current terminal of the thirtieth transistor M30. Furthermore, the first current terminal of the thirtieth transistor M30 is coupled to the second current terminal of the twenty-seventh transistor M27. The first current terminal of the twenty-seventh transistor M27 is coupled to the second current terminal of the twenty-eighth transistor M28. The first current terminal of the twenty-eighth transistor M28 is coupled to the ground terminal GND.

The ninth subset of transistors M25-M28 may be configured to receive the plurality of clock signals and the plurality of inverted clock signals. In other words, the control terminal of the twenty-fifth transistor M25 may receive the second clock signal SC, the control terminal of the twenty-sixth transistor M26 may receive the first inverted clock signal IF, the control terminal of the twenty-seventh transistor M27 may receive the first clock signal FC, and the control terminal of the twenty-eighth transistor M28 may receive the second inverted clock signal IS. Further, the tenth subset of transistors M29-M30 may be configured to receive the first latch signal FL and output the fifth inverter signal I5. In other words, the control terminal of the twenty-ninth transistor M29 and the control terminal of the thirtieth transistor M30 may receive the first latch signal FL. Further, a fifth output node O5 formed by the coupling of the second current terminal of the twenty-ninth transistor M29 and the second current terminal of the thirtieth transistor M30 outputs the fifth inverter signal I5.

Each of the twenty-fifth transistor M25, the twenty-sixth transistor M26, and the twenty-ninth transistor M29 may be a PMOS transistor. Thus, the twenty-fifth transistor M25, the twenty-sixth transistor M26, and the twenty-ninth transistor M29 may be collectively referred to as a "PMOS string of the fifth inverter 202*e*" or a "stack of first conductivity type transistors". Each of the twenty-seventh transistor M27, the twenty-eighth transistor M28, and the thirtieth transistor M30 may be an NMOS transistor. Thus, the twenty-seventh transistor M27, the twenty-eighth transistor M28, and the thirtieth transistor M30 may be collectively referred to as an "NMOS string of the fifth inverter 202*e*" or a "stack of second conductivity type transistors".

Sixth Inverter 202*f*

The sixth inverter 202*f* may be coupled to the digitally controlled oscillator 104, the plurality of inverting circuits 108*a*-108*b*, the third logic circuit 208, and the fourth logic circuit 210. The sixth inverter 202*f* may be further configured to receive the first divided signal FD, the first clock signal FC, the second clock signal SC, the first inverted clock signal IF, and the second inverted clock signal IS. The sixth inverter 202*f* may be further configured to output a sixth inverter signal I6 based on the first divided signal FD, the first clock signal FC, the second clock signal SC, the first inverted clock signal IF, and the second inverted clock signal IS.

The sixth inverter 202*f* may include a sixth plurality of transistors M31-M36 that may be connected in a cascade form between the power source terminal VDD and the ground terminal GND. The sixth plurality of transistors M31-M36 may include an eleventh subset of transistors M31-M34 and a twelfth subset of transistors M35-M36. Further, an eleventh subset of transistors M31-M34 may include thirty-first through thirty-fourth transistors M31-M34, and the twelfth subset of transistors M35-M36 may include a thirty-fifth transistor M35 and a thirty-sixth transistor M36. Each transistor of the sixth plurality of transistors M31-M36 may include a first current terminal, a second current terminal, and a control terminal. In an embodiment, the first current terminal, the second current terminal, and the control terminal correspond to source, drain, and gate terminals of a corresponding transistor.

The first current terminal of the thirty-first transistor M31 may be coupled to the power source terminal VDD and the second current terminal of the thirty-first transistor M31 may be coupled to the first current terminal of the thirty-second transistor M32. Further, the second current terminal of the thirty-second transistor M32 is coupled to the first current terminal of the thirty-fifth transistor M35. Additionally, the second current terminal of the thirty-fifth transistor M35 is coupled to the second current terminal of the thirty-sixth transistor M36. Furthermore, the first current terminal of the thirty-sixth transistor M36 is coupled to the second current terminal of the thirty-third transistor M33. The first current terminal of the thirty-third transistor M33 is coupled to the second current terminal of the thirty-fourth transistor M34. The first current terminal of the thirty-fourth transistor M34 is coupled to the ground terminal GND.

The eleventh subset of transistors M31-M34 may be configured to receive the plurality of clock signals and the plurality of inverted clock signals. In other words, the control terminal of the thirty-first transistor M31 may receive the second inverted clock signal IS, the control terminal of the thirty-second transistor M32 may receive the first clock signal FC, the control terminal of the thirty-third transistor M33 may receive the second clock signal SC, and the control terminal of the thirty-fourth transistor M34 may receive the first inverted clock signal IF. Further, the twelfth subset of transistors M35-M36 may be configured to receive the first divided signal FD and output the sixth inverter signal I6. In other words, the control terminal of the thirty-fifth transistor M35 and the control terminal of the thirty-sixth transistor M36 may receive the first divided signal FD. Further, a sixth output node O6 formed by the coupling of the second current terminal of the thirty-fifth transistor M35 and the second current terminal of the thirty-sixth transistor M36 outputs the sixth inverter signal I6. The fifth output node O5 and the sixth output node O6 may be shorted.

Each of the thirty-first transistor M31, the thirty-second transistor M32, and the thirty-fifth transistor M35 may be a PMOS transistor. Thus, the thirty-first transistor M31, the thirty-second transistor M32, and the thirty-fifth transistor M35 may be collectively referred to as a "PMOS string of the sixth inverter 202*f*" or a "stack of first conductivity type transistors". Each of the thirty-third transistor M33, the thirty-fourth transistor M34, and the thirty-sixth transistor M36 may be an NMOS transistor. Thus, the thirty-third transistor M33, the thirty-fourth transistor M34, and the thirty-sixth transistor M36 may be collectively referred to as an "NMOS string of the sixth inverter 202*f*" a "stack of second conductivity type transistors".

Seventh Inverter 202*g*

The seventh inverter 202*g* may be coupled to the digitally controlled oscillator 104, the plurality of inverting circuits 108*a*-108*b*, the third logic circuit 208, and the fourth logic circuit 210. The seventh inverter 202*g* may be configured to receive the second divided signal SD, the first clock signal FC, the second clock signal SC, the first inverted clock signal IF, and the second inverted clock signal IS. The seventh inverter 202*g* may be further configured to output a seventh inverter signal I7 based on the second divided signal SD, the first clock signal FC, the second clock signal SC, the first inverted clock signal IF, and the second inverted clock signal IS.

The seventh inverter 202*g* may include a seventh plurality of transistors M37-M42 that may be connected in a cascade form between the power source terminal VDD and the ground terminal GND. The seventh plurality of transistors M37-M42 may include a thirteenth subset of transistors M37-M40 and a fourteenth subset of transistors M41-M42. The thirteenth subset of transistors M37-M40 may include thirty-seventh through fortieth transistors M37-M40 and the fourteenth subset of transistors M41-M42 may include a forty-first transistor M41 and a forty-second transistor M42. Each transistor of the seventh plurality of transistors M37-M42 may include a first current terminal, a second current terminal, and a control terminal. In an embodiment, the first current terminal, the second current terminal, and the control terminal correspond to source, drain, and gate terminals of a corresponding transistor.

The first current terminal of the thirty-seventh transistor M37 may be coupled to the power source terminal VDD and the second current terminal of the thirty-seventh transistor M37 may be coupled to the first current terminal of the thirty-eighth transistor M38. Further, the second current terminal of the thirty-eighth transistor M38 is coupled to the first current terminal of the forty-first transistor M41. Additionally, the second current terminal of the forty-first transistor M41 is coupled to the second current terminal of the forty-second transistor M42. Furthermore, the first current terminal of the forty-second transistor M42 is coupled to the second current terminal of the thirty-ninth transistor M39. The first current terminal of the thirty-ninth transistor M39 is coupled to the second current terminal of the fortieth transistor M40. The first current terminal of the fortieth transistor M40 is coupled to the ground terminal GND.

The thirteenth subset of transistors M37-M40 may be configured to receive the plurality of clock signals and the plurality of inverted clock signals. In other words, the control terminal of the thirty-seventh transistor M37 may receive the second inverted clock signal IS, the control terminal of the thirty-eighth transistor M38 may receive the first clock signal FC, the control terminal of the thirty-ninth transistor M39 may receive the second clock signal SC, and the control terminal of the fortieth transistor M40 may receive the first inverted clock signal IF. Further, the fourteenth subset of transistors M41-M42 may be configured to receive the second divided signal SD and output the seventh inverter signal I7. In other words, the control terminal of the forty-first transistor M41 and the control terminal of the forty-second transistor M42 may receive the second divided signal SD. Further, a seventh output node O7 formed by the coupling of the second current terminal of the forty-first transistor M41 and the second current terminal of the forty-second transistor M42 outputs the seventh inverter signal I7.

Each of the thirty-seventh transistor M37, the thirty-eighth transistor M38, and the forty-first transistor M41 may be a PMOS transistor. Thus, the thirty-seventh transistor M37, the thirty-eighth transistor M38, and the forty-first transistor M41 may be collectively referred to as a "PMOS string of the seventh inverter 202*g*" or a "stack of first conductivity type transistors". Each of the thirty-ninth transistor M39, the fortieth transistor M40, and the forty-second transistor M42 may be an NMOS transistor. Thus, the thirty-ninth transistor M39, the fortieth transistor M40, and the forty-second transistor M42 may be collectively referred to as an "NMOS string of the seventh inverter 202*g*" or a "stack of second conductivity type transistors".

Eighth Inverter 202*h*

The eighth inverter 202*h* may be coupled to the digitally controlled oscillator 104, the plurality of inverting circuits 108*a*-108*b*, the first differential latch circuit 110, and the fourth logic circuit 210. The eighth inverter 202*h* may be further configured to receive the second latch signal SL, the first clock signal FC, the second clock signal SC, the first inverted clock signal IF, and the second inverted clock signal IS. The eighth inverter 202*h* may be further configured to output an eighth inverter signal I8 based on the second latch signal SL, the first clock signal FC, the second clock signal SC, the first inverted clock signal IF, and the second inverted clock signal IS.

The eighth inverter 202*h* may include an eighth plurality of transistors M43-M48 that may be connected in a cascade form between the power source terminal VDD and the ground terminal GND. The eighth plurality of transistors M43-M48 may include a fifteenth subset of transistors M43-M46 and a sixteenth subset of transistors M47-M48. Further, the fifteenth subset of transistors M43-M46 may include forty-third through forty-sixth transistors M43-M46, and the sixteenth subset of transistors M47-M48 may include a forty-seventh transistor M47 and a forty-eighth transistor M48. Each transistor of the eighth plurality of transistors M43-M48 may include a first current terminal, a second current terminal, and a control terminal. In an embodiment, the first current terminal, the second current terminal, and the control terminal correspond to source, drain, and gate terminals of a corresponding transistor.

The first current terminal of the forty-third transistor M43 may be coupled to the power source terminal VDD and the second current terminal of the forty-third transistor M43 may be coupled to the first current terminal of the forty-fourth transistor M44. Further, the second current terminal of the forty-fourth transistor M44 is coupled to the first current terminal of the forty-seventh transistor M47. Additionally, the second current terminal of the forty-seventh transistor M47 is coupled to the second current terminal of the forty-eighth transistor M48. Furthermore, the first current terminal of the forty-eighth transistor M48 is coupled to the second current terminal of the forty-fifth transistor M45. The first current terminal of the forty-fifth transistor M45 is coupled to the second current terminal of the forty-sixth transistor M46. The first current terminal of the forty-sixth transistor M46 is coupled to the ground terminal GND.

The fifteenth subset of transistors M43-M46 may be configured to receive the plurality of clock signals and the plurality of inverted clock signals. In other words, the control terminal of the forty-third transistor M43 may receive the second clock signal SC, the control terminal of the forty-fourth transistor M44 may receive the first inverted clock signal IF, the control terminal of the forty-fifth transistor M45 may receive the first clock signal FC, and the control terminal of the forty-sixth transistor M46 may receive the second inverted clock signal IS. Further, the sixteenth subset of transistors M47-M48 may be configured to receive the second latch signal SL and output the eighth inverter signal I8. In other words, the control terminals of the forty-seventh transistor M47 and the forty-eighth transistor M48 may receive the second latch signal SL. Further, an eighth output node O8 formed by the coupling of the second current terminal of the forty-seventh transistor M47 and the second current terminal of the forty-eighth transistor M48 outputs the eighth inverter signal I8. The seventh output node O7 and the eighth output node O8 may be shorted.

Each of the forty-third transistor M43, the forty-fourth transistor M44, and the forty-seventh transistor M47 may be a PMOS transistor. Thus, the forty-third transistor M43, the forty-fourth transistor M44, and the forty-seventh transistor M47 may be collectively referred to as a "PMOS string of the eighth inverter 202*h*" or a "stack of first conductivity type transistors". Each of the forty-fifth transistor M45, the forty-sixth transistor M46, and the forty-eighth transistor M48 may be an NMOS transistor. Thus, the forty-fifth transistor M45, the forty-sixth transistor M46, and the forty-eighth transistor M48 may be collectively referred to as an "NMOS string of the eighth inverter 202*h*" or a "stack of second conductivity type transistors".

Third Logic Circuit 208

The third logic circuit 208 may be coupled to the fifth inverter 202*e*, the sixth inverter 202*f*, the seventh inverter 202*g*, and the first differential latch circuit 110. The third logic circuit 208 may include suitable circuity to perform one or more operations. For example, the third logic circuit 208 may be configured to receive a third logic signal L3 from the shorted fifth and sixth output nodes O5 and O6. The third logic signal L3 may be based on the fifth inverter signal I5 and the sixth inverter signal I6. The third logic circuit 208 may be further configured to hold a third voltage level of the third logic signal L3 for a time duration that is based on the first clock signal FC laggings or leading the second clock signal SC. In further embodiments, the third logic circuit 208 may correspond to a third pair of back-to-back inverters. The third logic circuit 208 may be further configured to output the second divided signal SD based on the third voltage level of the third logic signal L3.

Fourth Logic Circuit 210

The fourth logic circuit 210 may be coupled to the sixth inverter 202*f*, the seventh inverter 202*g*, the eighth inverter 202*h*, and the first differential latch circuit 110. The fourth logic circuit 210 may include suitable circuity to perform one or more operations. For example, the fourth logic circuit 210 may be configured to receive a fourth logic signal L4 from the shorted seventh and eighth output nodes O7 and O8. The fourth logic signal L4 may be based on the seventh inverter signal I7 and the eighth inverter signal I8. The fourth logic circuit 210 may be further configured to hold a fourth voltage level of the fourth logic signal L4 for the time duration that is based on the first clock signal FC leading or lagging the second clock signal SC. In further embodiments, the fourth logic circuit 210 may correspond to a fourth pair of back-to-back inverters. The fourth logic circuit 210 may be further configured to output the first divided signal FD based on the fourth voltage level of the fourth logic signal L4.

The fifth through eighth inverters 202*e*-202*h*, the third logic circuit 208, and the fourth logic circuit 210 may operate similarly to the first through fourth inverters 202*a*-202*d*, the first logic circuit 204, and the second logic circuit 206, respectively, to generate the first divided signal FD and the second divided signal SD that may be substantially ripple-free. Thus, the first divided signal FD corresponds to one of the seventh inverter signal I7 and the eighth inverter signal I8. Similarly, the second divided signal SD corresponds to one of the fifth inverter signal I5 and the sixth inverter signal I6.

To summarize, the fifth through eighth inverters 202*e*-202*h* may be configured to receive the plurality of latch signals, the plurality of clock signals, and the plurality of inverted clock signals. The fifth through eighth inverters 202*e*-202*h* may be further configured to output the plurality of divided signals based on the plurality of latch signals, the plurality of clock signals, and the plurality of inverted clock signals.

Figure 3A:
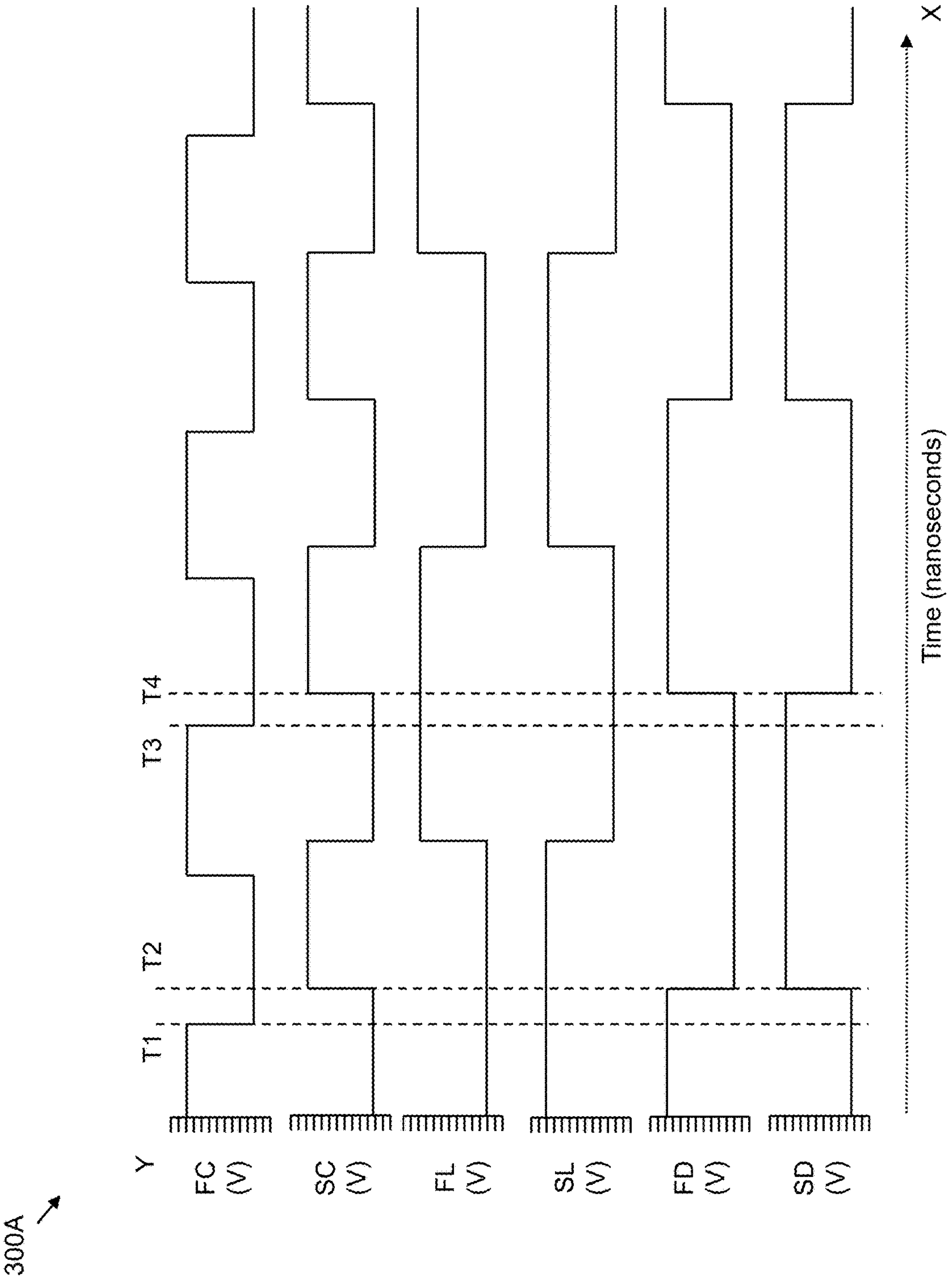
FIG. 3A illustrates a timing diagram that illustrates an operation of the divider circuit of the integrated circuit of FIG. 1 in accordance with an embodiment of the present disclosure.

FIG. 3A represents a timing diagram 300A that illustrates an operation of the divider circuit 106 in accordance with an embodiment of the present disclosure. The X-axis of the timing diagram 300A may indicate time in nanoseconds and the Y-axis of the timing diagram 300A may indicate a voltage level in volts (V).

The first clock signal FC and the second clock signal SC may include a first and second plurality of clock cycles, respectively. At a time instance T1, a first clock cycle of the first plurality of clock cycles transitions from an asserted state to a de-asserted state. Further, at a time instance T2, a first clock cycle of the second plurality of clock cycles transitions from a de-asserted state to an asserted state. The time instance T1 occurs prior to the time instance T2. Thus, a falling edge of the first clock signal FC is leading a rising edge of the second clock signal SC by a time period T1-T2. The time period T1-T2 may be the skew time between the first clock signal FC and the second clock signal SC. Further, the first latch signal FL may be de-asserted and the second latch signal SL may be asserted. As a result, the divider circuit 106 may transition the first divided signal FD to a de-asserted state and the second divided signal SD to an asserted state at the time instance T2 based on the raising edge of the second clock signal SC. In the skew time, the divider circuit 106 may hold voltage levels of the first divided signal FD at an asserted state and the second divided signal SD at a de-asserted state such that floating values of the first divided signal FD and the second divided signal SD are avoided.

During a time period T2-T4, the divider circuit 106 may maintain the first divided signal FD at the de-asserted state and the second divided signal SD at the asserted state. Additionally, during a time period T3-T4 (e.g., a skew time), the divider circuit 106 may hold the voltage levels of the first divided signal FD at the de-asserted state and the second divided signal SD at the asserted state such that the floating values of the first divided signal FD and the second divided signal SD may be avoided. The divider circuit 106 may further transition the first divided signal FD to the asserted state and the second divided signal SD to the de-asserted state at the time instance T4. Thus, the timing diagram 300A illustrates that the first divided signal FD and the second divided signal SD may remain substantially ripple-free in the presence of the skew between the first clock signal FC and the second clock signal SC.

Figure 3B:
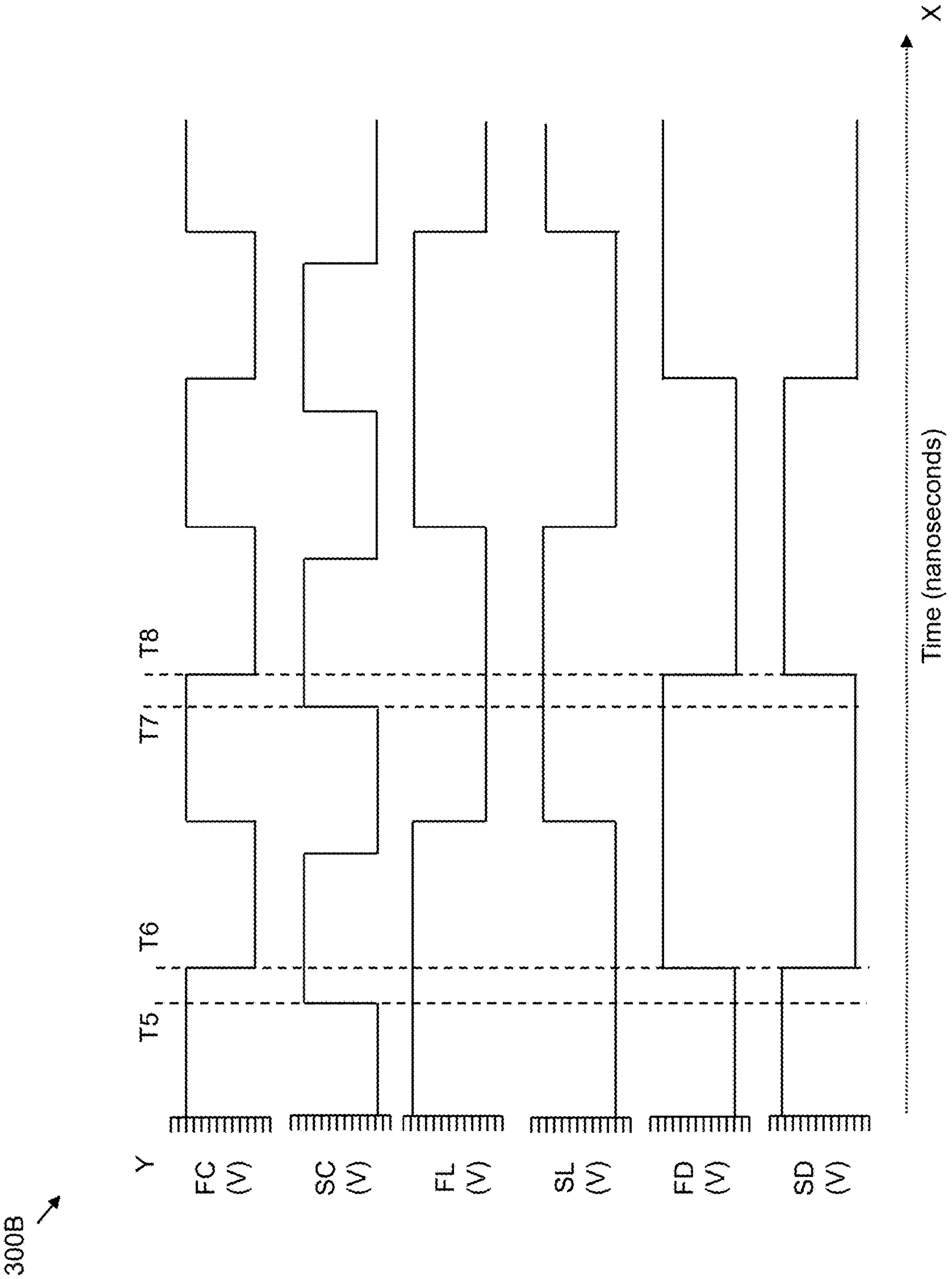
FIG. 3B illustrates a timing diagram that illustrates an operation of the divider circuit of the integrated circuit of FIG. 1 in accordance with another embodiment of the present disclosure.

FIG. 3B represents a timing diagram 300B that illustrates an operation of the divider circuit 106 in accordance with another embodiment of the present disclosure. The X-axis of the timing diagram 300B may indicate time in nanoseconds and the Y-axis of the timing diagram 300B may indicate a voltage level in volts (V).

At a time instance T5, the first clock cycle of the second plurality of clock cycles of the second clock signal SC transitions from a de-asserted state to an asserted state. Further, at a time instance T6, the first clock cycle of the first plurality of clock cycles of the first clock signal FC transitions from an asserted state to a de-asserted state. Thus, a rising edge of the second clock signal SC is leading a falling edge of the first clock signal FC by a time period T5-T6. The time period T5-T6 may be the skew time between the first clock signal FC and the second clock signal SC. Further, the first latch signal FL may be asserted and the second latch signal SL may be de-asserted. As a result, the divider circuit 106 may transition the first divided signal FD to an asserted state and the second divided signal SD to a de-asserted state at the time instance T6 based on the falling edge of the first clock signal FC.

In the skew time, the divider circuit 106 may hold voltage levels of the first divided signal FD at a de-asserted state and the second divided signal SD at an asserted state such that, the floating values of the first divided signal FD and the second divided signal SD are avoided. During a time period T6-T8, the divider circuit 106 may maintain the first divided signal FD at the asserted state and the second divided signal SD at the de-asserted state. Additionally, during a time period T7-T8 (e.g., a skew time) the divider circuit 106 may hold the voltage levels of the first divided signal FD at the asserted state and the second divided signal SD at the de-asserted state such that floating values of the first divided signal FD and the second divided signal SD may be avoided. The divider circuit 106 may transition the first divided signal FD to the de-asserted state and the second divided signal SD to the asserted state at the time instance T8. Thus, the timing diagram 300B illustrates that the first divided signal FD and the second divided signal SD may remain substantially ripple-free in presence of the skew between the first clock signal FC and the second clock signal SC.

As FIGS. 3A and 3B illustrate that the first and second latch signals FL and SL and the first and second divided signals FD and SD may be substantially ripple-free in the presence of the skew between the first clock signal FC and the second clock signal SC, the divider circuit 106 may be skew insensitive.

In the present disclosure, the term "assert" refers to placing a signal in a logic high state and the term "de-assert" refers to placing a signal in a logic low state.

The present disclosure discloses the divider circuit 106 that is skew insensitive due to the utilization of the first inverted clock signal IF, the inverted first clock signal IF, the second clock signal SC, and the inverted second clock signal IS to generate the first and second divided signals FD and SD. Further, the divider circuit 106 has a robust design and generates the plurality of divided signals that may be substantially ripple-free. Thus, a system that includes the IC 100 may operate in a desired manner as a frequency of operation of the divider circuit 106 may remain unaffected. In some embodiments, the IC 100 may be implemented in systems using any standard CMOS technology. Additionally, the divider circuit 106 generates the plurality of divided signals with a 50% duty cycle.

In an embodiment of the present disclosure, a divider circuit is disclosed. The divider circuit may comprise a first differential latch circuit and a second differential latch circuit coupled to the first differential latch circuit. The first differential latch circuit may be configured to receive a plurality of input signals, a plurality of clock signals, and inverted versions of the plurality of clock signals. The first differential latch circuit may be further configured to generate a plurality of latch signals based on the plurality of input signals, the plurality of clock signals, and the inverted versions of the plurality of clock signals. The second differential latch circuit may be configured to receive the plurality of latch signals, the plurality of clock signals, and the inverted versions of the plurality of clock signals. The second differential latch circuit may be further configured to generate a plurality of divided signals based on the plurality of latch signals, the plurality of clock signals, and the inverted versions of the plurality of clock signals. The plurality of divided signals correspond to (i) frequency divided versions of the plurality of clock signals and (ii) the plurality of input signals.

In some embodiments, the first differential latch circuit may comprise first, second, third, and fourth inverters. Each of the first through fourth inverters may be configured to receive the plurality of clock signals and the inverted versions of the plurality of clock signals.

In some embodiments, the first inverter may be further configured to receive a first input signal of the plurality of input signals and output a first inverter signal at a first output node. The second inverter may be further configured to receive a first latch signal of the plurality of latch signals and output a second inverter signal at a second output node. The first and second output nodes are shorted. The third inverter may be further configured to receive a second latch signal of the plurality of latch signals and output a third inverter signal at a third output node. Further, the fourth inverter may be configured to receive a second input signal of the plurality of input signals and output a fourth inverter signal at a fourth output node. The third and fourth output nodes are shorted.

In some embodiments, each inverter of the first through fourth inverters may comprise a first plurality of transistors. Further, the first plurality of transistors are connected in a cascade form between a power source terminal and a ground terminal.

In some embodiments, the first plurality of transistors of the first inverter may comprise a first subset of transistors and a second subset of transistors. The first subset of transistors may be configured to receive the plurality of clock signals and the inverted versions of the plurality of clock signals. Further, the second subset of transistors may be configured to receive the first input signal and output the first inverter signal. The first plurality of transistors of the second inverter may comprise a third subset of transistors and a fourth subset of transistors. The third subset of transistors may be configured to receive the plurality of clock signals and the inverted versions of the plurality of clock signals. Further, a fourth subset of transistors may be configured to receive the first latch signal and output the second inverter signal. The first plurality of transistors of the third inverter may comprise a fifth subset of transistors and a sixth subset of transistors. The fifth subset of transistors may be configured to receive the plurality of clock signals and the inverted versions of the plurality of clock signals. Further, the sixth subset of transistors may be configured to receive the second latch signal and output the third inverter signal. The first plurality of transistors of the fourth inverter may comprise a seventh subset of transistors and an eighth subset of transistors. The seventh subset of transistors may be configured to receive the plurality of clock signals and the inverted versions of the plurality of clock signals. Further, the eighth subset of transistors may be configured to receive the second input signal and output the fourth inverter signal.

In some embodiments, the first latch signal may correspond to one of the third inverter signal and the fourth inverter signal, and the second latch signal may correspond to one of the first inverter signal and the second inverter signal.

In some embodiments, the plurality of clock signals may comprise a first clock signal and a second clock signal. The first clock signal leads or lags the second clock signal by a first time period.

In some embodiments, the first differential latch circuit further comprises a first logic circuit coupled to the first through third inverters. The first logic circuit may be configured to receive a first logic signal from the shorted first and second output nodes. The first logic signal is based on the first inverter signal and the second inverter signal. The first logic circuit may be further configured to hold a first voltage level of the first logic signal during the first time period and output the second latch signal based on the first voltage level.

In some embodiments, the first differential latch circuit may further comprise a second logic circuit coupled to the second through fourth inverters. The second logic circuit may be configured to receive a second logic signal from the shorted third and fourth output nodes. The second logic signal is based on the third inverter signal and the fourth inverter signal. The second logic circuit may be further configured to hold a second voltage level of the second logic signal during the first time period and output the first latch signal based on the second voltage level.

In some embodiments, the second differential latch circuit may comprise fifth, sixth, seventh, and eighth inverters.

Each of the fifth through eighth inverters may be configured to receive the plurality of clock signals and the inverted versions of the plurality of clock signals.

In some embodiments, the fifth inverter may be further configured to receive the first latch signal and output a fifth inverter signal at a fifth output node. The sixth inverter may be further configured to receive a first divided signal of the plurality of divided signals and output a sixth inverter signal at a sixth output node. The fifth and sixth output nodes are shorted. The seventh inverter may be further configured to receive a second divided signal the plurality of divided signals and output a seventh inverter signal at a seventh output node. The eighth inverter may be further configured to receive the second latch signal and output an eighth inverter signal at an eighth output node. The seventh and eighth output nodes are shorted.

In some embodiments, each inverter of the fifth through eighth inverters may comprise a second plurality of transistors. Further, the second plurality of transistors are connected in a cascade form between a power source terminal and a ground terminal.

In some embodiments, the second plurality of transistors of the fifth inverter may comprise a ninth subset of transistors and a tenth subset of transistors. The ninth subset of transistors may be configured to receive the plurality of clock signals and the inverted versions of the plurality of clock signals. Further, the tenth subset of transistors may be configured to receive the first latch signal and output the fifth inverter signal. The second plurality of transistors of the sixth inverter may comprise an eleventh subset of transistors and a twelfth subset of transistors. The eleventh subset of transistors may be configured to receive the plurality of clock signals and the inverted versions of the plurality of clock signals. Further, a twelfth subset of transistors may be configured to receive the first divided signal and output the sixth inverter signal. The second plurality of transistors of the seventh inverter may comprise a thirteenth subset of transistors and a fourteenth subset of transistors. The thirteenth subset of transistors may be configured to receive the plurality of clock signals and the inverted versions of the plurality of clock signals. Further, the fourteenth subset of transistors may be configured to receive the second divided signal and output the seventh inverter signal. The second plurality of transistors of the eighth inverter may comprise a fifteenth subset of transistors and a sixteenth subset of transistors. The fifteenth subset of transistors may be configured to receive the plurality of clock signals and the inverted versions of the plurality of clock signals. Further, the sixteenth subset of transistors may be configured to receive the second latch signal and output the eighth inverter signal.

In some embodiments, the first divided signal may correspond to one of the seventh inverter signal and the eighth inverter signal, and the second divided signal may correspond to one of the fifth inverter signal and the sixth inverter signal.

In some embodiments, the plurality of clock signals may comprise a first clock signal and a second clock signal. The first clock signal leads or lags the second clock signal by a first time period.

In some embodiments, the second differential latch circuit may further comprise a third logic circuit coupled to the fifth through seventh inverters. The third logic circuit may be configured to receive a third logic signal from the shorted fifth and sixth output nodes. The third logic signal is based on the fifth inverter signal and the sixth inverter signal. The third logic circuit may be further configured to hold a third voltage level of the third logic signal during the first time period and output the second divided signal based on the third voltage level.

In some embodiments, the second differential latch circuit may further comprise a fourth logic circuit coupled to the sixth through eighth inverters. The fourth logic circuit may be configured to receive a fourth logic signal from the shorted seventh and eighth output nodes. The fourth logic signal is based on the seventh inverter signal and the eighth inverter signal. The fourth logic circuit may be further configured to hold a fourth voltage level of the fourth logic signal during the first time period and output the first divided signal based on the fourth voltage level.

In some embodiments, the divider circuit may further comprise a plurality of inverting circuits coupled to each of the first differential latch circuit and the second differential latch circuit. Each inverting circuit of the plurality of inverting circuits may be configured to receive a clock signal of the plurality of clock signals and invert the received clock signal. Each inverting circuit of the plurality of inverting circuits may be further configured to provide an inverted version of the clock signal to the first differential latch circuit and the second differential latch circuit. The inverted version of the clock signal corresponds to one of the inverted versions of the plurality of clock signals.

In some embodiments, each divided signal of the plurality of divided signals may be substantially ripple-free.

In another embodiment of the present disclosure, a divider circuit is disclosed. The divider circuit may comprise a plurality of differential latch circuits. A first differential latch circuit of the plurality of differential latch circuits may comprise first, second, third, and fourth inverters. Further, a second differential latch of the plurality of differential latch circuits may comprise fifth, sixth, seventh, and eighth inverters. Each inverter of the first through eighth inverters may comprise a stack of first conductivity type transistors and a stack of second conductivity type transistors coupled to the stack of first conductivity type transistors. Further, the first through fourth inverters of the first differential latch circuit of the plurality of differential latch circuits may be configured to receive a plurality of input signals, a plurality of clock signals, and inverted versions of the plurality of clock signals and output a plurality of latch signals based on the plurality of input signals, the plurality of clock signals, and the inverted versions of the plurality of clock signals. Additionally, the fifth through eighth inverters of the second differential latch circuit of the plurality of differential latch circuits may be configured to receive the plurality of latch signals, the plurality of clock signals, and the inverted versions of the plurality of clock signals and output a plurality of divided signals based on the plurality of latch signals, the plurality of clock signals, and the inverted versions of the plurality of clock signals. Each divided signal of the plurality of divided signals corresponds to frequency divided versions of the plurality of clock signals and the plurality of input signals.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The term "coupled" may refer to at least one of direct or indirect coupling that may not necessarily be by way of mechanical or any physical means. Further, a system or method that "comprises", "has", or "includes" one or more elements possesses those one or more elements but is not limited to possessing only those one or more elements.

What is claimed is:

1. A divider circuit comprising:

a first differential latch circuit configured to receive a plurality of input signals, a plurality of clock signals, and inverted versions of the plurality of clock signals, and generate a plurality of latch signals based on the plurality of input signals, the plurality of clock signals, and the inverted versions of the plurality of clock signals, wherein the first differential latch circuit comprises first, second, third, and fourth inverters, and each of the first through fourth inverters is configured to receive the plurality of clock signals and the inverted versions of the plurality of clock signals; and a second differential latch circuit coupled to the first differential latch circuit, wherein the second differential latch circuit is configured to receive the plurality of latch signals, the plurality of clock signals, and the inverted versions of the plurality of clock signals, and generate a plurality of divided signals based on the plurality of latch signals, the plurality of clock signals, and the inverted versions of the plurality of clock signals, wherein the plurality of divided signals correspond to frequency divided versions of the plurality of clock signals and the plurality of input signals.

2. The divider circuit of claim 1, wherein:

the first inverter is further configured to receive a first input signal of the plurality of input signals, and output a first inverter signal at a first output node;

the second inverter is further configured to receive a first latch signal of the plurality of latch signals, and output a second inverter signal at a second output node, wherein the first and second output nodes are shorted;

the third inverter is further configured to receive a second latch signal of the plurality of latch signals, and output a third inverter signal at a third output node; and the fourth inverter is further configured to receive a second input signal of the plurality of input signals, and output a fourth inverter signal at a fourth output node, wherein the third and fourth output nodes are shorted.

3. The divider circuit of claim 2, wherein each inverter of the first through fourth inverters comprises a first plurality of transistors, and wherein the first plurality of transistors are connected in a cascade form between a power source terminal and a ground terminal.

4. The divider circuit of claim 3, wherein:

the first plurality of transistors of the first inverter comprises a first subset of transistors configured to receive the plurality of clock signals and the inverted versions of the plurality of clock signals, and a second subset of transistors configured to receive the first input signal, and output the first inverter signal;

the first plurality of transistors of the second inverter comprises a third subset of transistors configured to receive the plurality of clock signals and the inverted versions of the plurality of clock signals, and a fourth subset of transistors configured to receive the first latch signal, and output the second inverter signal;

the first plurality of transistors of the third inverter comprises a fifth subset of transistors configured to receive the plurality of clock signals and the inverted versions of the plurality of clock signals, and a sixth subset of transistors configured to receive the second latch signal, and output the third inverter signal; and the first plurality of transistors of the fourth inverter comprises a seventh subset of transistors configured to receive the plurality of clock signals and the inverted versions of the plurality of clock signals, and an eighth subset of transistors configured to receive the second input signal, and output the fourth inverter signal.

5. The divider circuit of claim 2, wherein the first latch signal corresponds to one of the third inverter signal and the fourth inverter signal, and wherein the second latch signal corresponds to one of the first inverter signal and the second inverter signal.

6. The divider circuit of claim 2, wherein the plurality of clock signals comprises a first clock signal and a second clock signal, and wherein the first clock signal leads or lags the second clock signal by a first time period.

7. The divider circuit of claim 6, wherein the first differential latch circuit further comprises:

a first logic circuit coupled to the first through third inverters, and wherein the first logic circuit is configured to receive a first logic signal from the shorted first and second output nodes, wherein the first logic signal is based on the first inverter signal and the second inverter signal;

hold a first voltage level of the first logic signal during the first time period; and output the second latch signal based on the first voltage level.

8. The divider circuit of claim 7, wherein the first differential latch circuit further comprises:

a second logic circuit coupled to the second through fourth inverters, and wherein the second logic circuit is configured to receive a second logic signal from the shorted third and fourth output nodes, wherein the second logic signal is based on the third inverter signal and the fourth inverter signal;

hold a second voltage level of the second logic signal during the first time period; and output the first latch signal based on the second voltage level.

9. The divider circuit of claim 2, wherein:

the second differential latch circuit comprises fifth, sixth, seventh, and eighth inverters; and each of the fifth through eighth inverters is configured to receive the plurality of clock signals and the inverted versions of the plurality of clock signals.

10. The divider circuit of claim 9, wherein:
the fifth inverter is further configured to
receive the first latch signal, and
output a fifth inverter signal at a fifth output node;
the sixth inverter is further configured to
receive a first divided signal of the plurality of divided signals, and
output a sixth inverter signal at a sixth output node, wherein the fifth and sixth output nodes are shorted;
wherein the seventh inverter is further configured to
receive a second divided signal the plurality of divided signals, and
output a seventh inverter signal at a seventh output node; and
wherein the eighth inverter is further configured to
receive the second latch signal, and
output an eighth inverter signal at an eighth output node, wherein the seventh and eighth output nodes are shorted.

11. The divider circuit of claim 10, wherein each inverter of the fifth through eighth inverters comprises a second plurality of transistors, and wherein the second plurality of transistors are connected in a cascade form between a power source terminal and a ground terminal.

12. The divider circuit of claim 11, wherein:
the second plurality of transistors of the fifth inverter comprises
a ninth subset of transistors configured to receive the plurality of clock signals and the inverted versions of the plurality of clock signals, and
a tenth subset of transistors configured to
receive the first latch signal, and
output the fifth inverter signal;
the second plurality of transistors of the sixth inverter comprises
an eleventh subset of transistors configured to receive the plurality of clock signals and the inverted versions of the plurality of clock signals, and
a twelfth subset of transistors configured to
receive the first divided signal, and
output the sixth inverter signal;
the second plurality of transistors of the seventh inverter comprises
a thirteenth subset of transistors configured to receive the plurality of clock signals and the inverted versions of the plurality of clock signals, and
a fourteenth subset of transistors configured to
receive the second divided signal, and
output the seventh inverter signal; and
the second plurality of transistors of the eighth inverter comprises
a fifteenth subset of transistors configured to receive the plurality of clock signals and the inverted versions of the plurality of clock signals, and
a sixteenth subset of transistors configured to
receive the second latch signal, and
output the eighth inverter signal.

13. The divider circuit of claim 10, wherein the first divided signal corresponds to one of the seventh inverter signal and the eighth inverter signal, and wherein the second divided signal corresponds to one of the fifth inverter signal and the sixth inverter signal.

14. The divider circuit of claim 10, wherein the plurality of clock signals comprises a first clock signal and a second clock signal, and wherein the first clock signal leads or lags the second clock signal by a first time period.

15. The divider circuit of claim 14, wherein the second differential latch circuit further comprises:
a third logic circuit coupled to the fifth through seventh inverters, and wherein the third logic circuit is configured to
receive a third logic signal from the shorted fifth and sixth output nodes, wherein the third logic signal is based on the fifth inverter signal and the sixth inverter signal;
hold a third voltage level of the third logic signal during the first time period; and
output the second divided signal based on the third voltage level.

16. The divider circuit of claim 15, wherein the second differential latch circuit further comprises:
a fourth logic circuit coupled to the sixth through eighth inverters, and wherein the fourth logic circuit is configured to
receive a fourth logic signal from the shorted seventh and eighth output nodes, wherein the fourth logic signal is based on the seventh inverter signal and the eighth inverter signal;
hold a fourth voltage level of the fourth logic signal during the first time period; and
output the first divided signal based on the fourth voltage level.

17. The divider circuit of claim 1, further comprising:
a plurality of inverting circuits coupled to each of the first differential latch circuit and the second differential latch circuit,
wherein each inverting circuit of the plurality of inverting circuits is configured to
receive a clock signal of the plurality of clock signals;
invert the received clock signal; and
provide an inverted version of the clock signal to the first differential latch circuit and the second differential latch circuit, wherein the inverted version of the clock signal corresponds to one of the inverted versions of the plurality of clock signals.

18. The divider circuit of claim 1, wherein each divided signal of the plurality of divided signals is substantially ripple-free.

19. A divider circuit comprising:
a plurality of differential latch circuits, wherein a first differential latch circuit of the plurality of differential latch circuits comprises first, second, third, and fourth inverters, a second differential latch circuit of the plurality of differential latch circuits comprises fifth, sixth, seventh, and eighth inverters, and wherein each inverter of the first through eighth inverters comprises a stack of first conductivity type transistors and a stack of second conductivity type transistors coupled to the stack of first conductivity type transistors, and wherein
(i) the first through fourth inverters of the first differential latch circuit of the plurality of differential latch circuits are configured to
receive a plurality of input signals, a plurality of clock signals, and inverted versions of the plurality of clock signals, and
output a plurality of latch signals based on the plurality of input signals, the plurality of clock signals, and the inverted versions of the plurality of clock signals; and
(ii) the fifth through eighth inverters of the second differential latch circuit of the plurality of differential latch circuits are configured to receive the plurality of latch signals, the plurality of clock signals, and the inverted versions of the plurality of clock signals, and output a plurality of divided signals based on the plurality of latch signals, the plurality of clock signals, and the inverted versions of the plurality of clock signals, wherein each divided signal of the plurality of divided signals corresponds to frequency divided versions of the plurality of clock signals and the plurality of input signals.

* * * * *